US010128142B2

(12) United States Patent
Farrens et al.

(10) Patent No.: US 10,128,142 B2
(45) Date of Patent: *Nov. 13, 2018

(54) SEMICONDUCTOR STRUCTURES INCLUDING CARRIER WAFERS AND ATTACHED DEVICE WAFERS, AND METHODS OF FORMING SUCH SEMICONDUCTOR STRUCTURES

(71) Applicant: Micron Technology, Inc., Boise, ID (US)

(72) Inventors: Sharon N. Farrens, Boise, ID (US); Keith R. Cook, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 15/272,769

(22) Filed: Sep. 22, 2016

(65) Prior Publication Data
US 2017/0011948 A1   Jan. 12, 2017

Related U.S. Application Data

(63) Continuation of application No. 14/245,485, filed on Apr. 4, 2014, now Pat. No. 9,472,518.

(51) Int. Cl.
*H01L 29/40* (2006.01)
*H01L 21/70* (2006.01)
(Continued)

(52) U.S. Cl.
CPC .... *H01L 21/6835* (2013.01); *H01L 21/02079* (2013.01); *H01L 21/263* (2013.01);
(Continued)

(58) Field of Classification Search
CPC .................. H01L 24/11; H01L 24/14; H01L 2924/12042; H01L 2924/3511;
(Continued)

(56) References Cited

U.S. PATENT DOCUMENTS 5,204,280 A   4/1993   Dhong et al.
6,180,496 B1   1/2001   Farrens et al.
(Continued)

OTHER PUBLICATIONS

Collins, Packaging Technology for Miniature IVD Instrumentation, Medical Device & Diagnostic Industry Magazine, Apr. 1, 1998, 14 pages.

(Continued)

*Primary Examiner* — Marcos D Pizarro
*Assistant Examiner* — Nelson Garces
(74) *Attorney, Agent, or Firm* — TraskBritt

(57) ABSTRACT

A semiconductor structure comprising a carrier wafer and a device wafer. The carrier wafer comprises trenches sized and configured to receive conductive pillars of the device wafer. The carrier wafer and the device wafer are fusion bonded together and back side processing effected on the device wafer. The device wafer may be released from the carrier wafer by one or more of mechanically cleaving, thermally cleaving, and mechanically separating. Methods of forming the semiconductor structure including the carrier wafer and the device wafer are disclosed.

21 Claims, 13 Drawing Sheets

(51) Int. Cl.
| | |
|---|---|
| *H01L 23/02* | (2006.01) |
| *H01L 23/48* | (2006.01) |
| *H01L 23/52* | (2006.01) |
| *H01L 21/683* | (2006.01) |
| *H01L 23/00* | (2006.01) |
| *H01L 21/02* | (2006.01) |
| *H01L 21/263* | (2006.01) |
| *H01L 21/268* | (2006.01) |
| *H01L 21/285* | (2006.01) |
| *H01L 21/288* | (2006.01) |
| *H01L 21/30* | (2006.01) |
| *H01L 21/302* | (2006.01) |
| *H01L 21/304* | (2006.01) |
| *H01L 21/306* | (2006.01) |
| *H01L 21/48* | (2006.01) |
| *H01L 21/762* | (2006.01) |
| *H01L 21/768* | (2006.01) |
| *H01L 21/822* | (2006.01) |
| *H01L 23/522* | (2006.01) |
| *H01L 25/065* | (2006.01) |

(52) U.S. Cl.
CPC .......... *H01L 21/268* (2013.01); *H01L 21/288* (2013.01); *H01L 21/2855* (2013.01); *H01L 21/28556* (2013.01); *H01L 21/302* (2013.01); *H01L 21/3003* (2013.01); *H01L 21/304* (2013.01); *H01L 21/3043* (2013.01); *H01L 21/30608* (2013.01); *H01L 21/4803* (2013.01); *H01L 21/76254* (2013.01); *H01L 21/76898* (2013.01); *H01L 21/822* (2013.01); *H01L 23/5226* (2013.01); *H01L 23/562* (2013.01); *H01L 24/05* (2013.01); *H01L 24/06* (2013.01); *H01L 24/11* (2013.01); *H01L 24/13* (2013.01); *H01L 24/14* (2013.01); *H01L 24/27* (2013.01); *H01L 24/29* (2013.01); *H01L 25/0657* (2013.01); *H01L 21/6836* (2013.01); *H01L 24/03* (2013.01); *H01L 2221/6834* (2013.01); *H01L 2221/68327* (2013.01); *H01L 2221/68381* (2013.01); *H01L 2224/02126* (2013.01); *H01L 2224/03002* (2013.01); *H01L 2224/0345* (2013.01); *H01L 2224/05009* (2013.01); *H01L 2224/05027* (2013.01); *H01L 2224/05139* (2013.01); *H01L 2224/05144* (2013.01); *H01L 2224/05147* (2013.01); *H01L 2224/05155* (2013.01); *H01L 2224/05184* (2013.01); *H01L 2224/05568* (2013.01); *H01L 2224/06181* (2013.01); *H01L 2224/10126* (2013.01); *H01L 2224/11002* (2013.01); *H01L 2224/131* (2013.01); *H01L 2224/13009* (2013.01); *H01L 2224/13014* (2013.01); *H01L 2224/13083* (2013.01); *H01L 2224/13144* (2013.01); *H01L 2224/13147* (2013.01); *H01L 2224/1401* (2013.01); *H01L 2224/14131* (2013.01); *H01L 2224/16145* (2013.01); *H01L 2224/73204* (2013.01); *H01L 2224/94* (2013.01); *H01L 2924/12042* (2013.01); *H01L 2924/3511* (2013.01)

(58) Field of Classification Search
CPC ... H01L 2224/11002; H01L 2224/1401; H01L 21/6835; H01L 21/30608; H01L 23/5226; H01L 21/2855; H01L 21/28556; H01L 21/288; H01L 25/0657; H01L 21/3043; H01L 24/29; H01L 21/304; H01L 21/302; H01L 21/268; H01L 21/263; H01L 21/76898; H01L 21/4803; H01L 23/562; H01L 21/76254; H01L 21/02079; H01L 21/3003; H01L 21/822; H01L 24/27; H01L 24/13; H01L 24/06; H01L 24/05; H01L 2224/05184; H01L 2224/05147; H01L 2224/131; H01L 2224/13144; H01L 2224/13147; H01L 2224/05144; H01L 2224/05139; H01L 2224/06181; H01L 2224/05009; H01L 2224/05155; H01L 2224/03002; H01L 2224/02126; H01L 21/6836; H01L 2224/0345; H01L 2224/13009; H01L 2224/16145; H01L 2224/05568; H01L 2224/13014; H01L 2221/68327; H01L 2224/10126; H01L 2224/13083; H01L 2224/94; H01L 24/03; H01L 2224/14131; H01L 2221/68381; H01L 2221/6834; H01L 2224/05027; H01L 2224/73204; H01L 2924/351
USPC ................................. 257/732–742, 681–691
See application file for complete search history.

(56) References Cited

U.S. PATENT DOCUMENTS

| | | | |
|---|---|---|---|
| 6,780,759 B2 | 8/2004 | Farrens et al. | |
| 7,034,401 B2 * | 4/2006 | Savastiouk | H01L 23/147 257/678 |
| 7,241,675 B2 * | 7/2007 | Savastiouk | H01L 23/13 257/E21.503 |
| 7,425,465 B2 | 9/2008 | Birkmeyer | |
| 7,485,562 B2 | 2/2009 | Chua et al. | |
| 8,263,478 B2 * | 9/2012 | Akiyama | H01L 21/76254 257/E21.568 |
| 8,618,648 B1 | 12/2013 | Kwon et al. | |
| 8,691,691 B2 | 4/2014 | Farooq et al. | |
| 9,472,518 B2 * | 10/2016 | Farrens | H01L 24/11 |
| 2003/0218102 A1 | 11/2003 | Van Dam et al. | |
| 2008/0194053 A1 | 8/2008 | Huang | |
| 2009/0140420 A1 | 6/2009 | Farooq et al. | |
| 2014/0017852 A1* | 1/2014 | Kwon | H01L 23/147 438/108 |
| 2014/0035109 A1* | 2/2014 | Volant | H01L 23/481 257/621 |
| 2015/0287687 A1 | 10/2015 | Farrens et al. | |

OTHER PUBLICATIONS

Shutov et al., A Microfabricated Electromagnetic Linear Synchronous Motor, Sensors and Acutuators Vo. A 121, (2005), pp. 566-575.

* cited by examiner

SEMICONDUCTOR STRUCTURES INCLUDING CARRIER WAFERS AND ATTACHED DEVICE WAFERS, AND METHODS OF FORMING SUCH SEMICONDUCTOR STRUCTURES

CROSS-REFERENCE TO RELATED APPLICATION

This application is a continuation of U.S. patent application Ser. No. 14/245,485, filed Apr. 4, 2014, now U.S. Pat. No. 9,472,518, issued Oct. 18, 2016, the disclosure of which is hereby incorporated herein in its entirety by this reference.

FIELD

Embodiments disclosed herein relate to semiconductor structures used during back side processing. More specifically, embodiments disclosed herein relate to the semiconductor structures and to methods of using such structures during formation and completion of back side circuitry, stacking of semiconductor devices, or both.

BACKGROUND

Forming semiconductor packages requires forming semiconductor structures on a front side, generally characterized as the "active surface," of a wafer or other bulk semiconductor substrate bearing a large number of semiconductor devices (which structures may be characterized generally as a "device wafer") and, in some instances, interconnecting the circuitry of the active surface with an opposite, or back side, of each semiconductor device (e.g., to contact pads, bond pads, etc.). After processing of the active surface is completed, the device wafer is inverted down and attached to a carrier wafer for completion of the back side.

A number of existing processes have been developed to form electrical connections between the back side and the active surface of semiconductor devices. For example, a device wafer may be temporarily bonded to a carrier wafer, the back side made be thinned and processed to form electrical interconnections with the active surface, and then released from the carrier wafer. Semiconductor substrates in the form of device wafers are conventionally bonded to carrier wafers and thinned down using techniques including "back grinding" and chemical mechanical planarization (CMP) to provide conductive access to the circuitry of the active surface side.

During back side processing, the active surface of the device wafer may become damaged or the bond between the carrier wafer and device wafer may weaken. For example, where an adhesive or a polymer material is used to temporarily bond the device wafer to the carrier wafer, exposing the adhesive or polymer to temperatures above about 200° C. may prematurely release the carrier wafer from the device wafer. In addition, the adhesive may damage or contaminate the active surface circuitry as well as conductive elements connected to such circuitry and protruding from the active surface since the circuitry and conductive elements are in contact with the adhesive during the back side processing. In addition, during thinning of the device wafer from the back side, the device wafer may become warped and the total thickness variation of the device wafer may increase because of the warping.

DETAILED DESCRIPTION

Figure 1A:
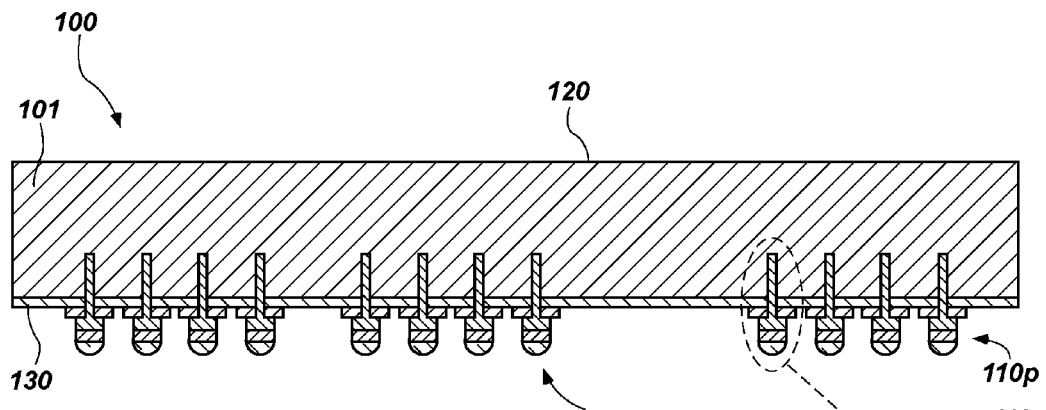
FIG. 1A through FIG. 1G are simplified cross-sectional and plan views showing a method of attaching a carrier wafer to a device wafer according to some embodiments of the disclosure.

The illustrations included herewith are not meant to be actual views of any particular systems or memory structures, but are merely idealized representations that are employed to describe embodiments described herein. Elements and features common between figures may retain the same numerical designation except that, for ease of following the description, for the most part, reference numerals begin with the number of the drawing on which the elements are introduced or most fully discussed.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete process flow for manufacturing semiconductor structures, and the structures described below do not form a complete semiconductor device. Only those process acts and structures necessary to understand the embodiments described herein are described in detail below. Additional acts to form a complete semiconductor device including the structures described herein may be performed by conventional techniques.

Methods of forming a carrier wafer to support a device wafer during back side processing are disclosed, as are wafer assemblies including the temporary carrier wafer and the device wafer. The carrier wafer may include trenches having dimensions that correspond to dimensions of features protruding from an active surface of the device wafer, such as conductive pillars on the device wafer. The trenches in the carrier wafer may be configured to receive the features of the device wafers, such as the conductive pillars. The carrier wafer and the device wafer may be bonded to one another, without using an adhesive, by activating surfaces of the carrier wafer and the device wafer and then contacting the carrier wafer and the device wafer. Since the features on the active surface of the device wafer are received in the trenches of the carrier wafer, the carrier wafer may provide support and protection to the device wafer during the back side processing. The carrier wafer may also include preformed cleaving points to promote releasing the carrier wafer from the device wafer. After the back side processing is complete, the carrier wafer and the device wafer may be separated from one another without causing damage to, or contamination of, the features on the active surface of the device wafer. The carrier wafer may be recycled after being released (e.g., cleaved) from the device wafer to support another device wafer and the process may be repeated. By reusing the carrier wafer to support another device wafer, the overall manufacturing cost of forming semiconductor devices may be significantly reduced.

Referring to FIG. 1A, a device wafer 100 is shown. The device wafer 100 includes electrical circuitry including conductive elements 110 formed over and within a substrate 101. A dielectric material 130 may overlie the substrate 101. The substrate 101 may be a semiconductor substrate, a base semiconductor layer on a supporting structure, a metal electrode or a semiconductor substrate having one or more layers, structures or regions formed thereon. The substrate 101 may be a conventional silicon substrate or other bulk substrate comprising a layer of semiconductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide.

The dielectric material 130 may include an oxide, a nitride, or an oxynitride such as a silicon dioxide, silicon nitride, or silicon oxynitride (e.g., $SiO_xN_y$, where x is between about 0.5 and about 1.0 and y is between about 0.5 and about 2.0). In other embodiments, the dielectric material 130 may include tetraethyl orthosilicate (TEOS), borophosphosilicate glass (BPSG), phosphosilicate glass (PSG), or other common dielectric materials known in the art. The dielectric material 130 may be selected to promote adhesion between a carrier wafer and the device wafer 100 in later bonding acts. The device wafer 100 includes a back side 120 that may be processed after the device wafer 100 is supported on the carrier wafer.

The conductive elements 110 may be electrically connected to one or more components and/or other conductive elements of the device wafer 100 and extend through dielectric material 130. For example, the conductive elements 110 may be electrically connected to one or more of transistors, capacitors, diodes, wordlines, bitlines, peripheral circuitry, vias, contacts, or other electrical circuitry of the device wafer 100. For simplicity, the electrical circuitry of the device wafer 100 is not shown. The conductive elements 110 may be formed by conventional techniques such as by one or more of electrolytic deposition, electroless deposition, conductive paste screening, patterning, material removal (e.g., wet etching, dry etching, ablation, etc.), photolithography, chemical vapor deposition, physical vapor deposition, bumping, etc., suitable for the selected material or materials of the conductive elements 110. The conductive elements 110 may include conductive pillars 110p sized, configured, and arranged to provide electrical contact points for electrically connecting to bond pads, terminals, or other conductive structures (not shown) of another semiconductor device, an interposer, or higher level packaging. By way of example and not limitation, each conductive element 110 may include one or more of copper, nickel, gold, silver, tin, tungsten, platinum, indium, solder (e.g., SnAg), polysilicon, or other conductive material. In some embodiments, each conductive element 110 may include, for example, a conductive via portion 112 that may partially form a through silicon via (TSV) extending at least partially through the device wafer 100, through an insulative material 114, to a second conductive portion 116, and a solder portion 118. The second conductive portion 116 and the solder portion 118 may, in this embodiment, be characterized as conductive pillar 110p. By way of non-limiting example, each conductive pillar 110p may also be configured as a copper pillar, a solder bump, a gold stud bump, a conductive epoxy bump, or a conductor-filled epoxy bump. However, the present disclosure is not limited to such examples of conductive elements 110. Rather, each conductive pillar 110p may include any sufficiently conductive material or a combination thereof and have any suitable structural form. Another dielectric material 113 may be formed between the conductive via portion 112 and the substrate 101 where the conductive via portion 112 extends into the device wafer 100. In some embodiments, the another dielectric material 113 is the same material as dielectric material 130.

Figure 1B:
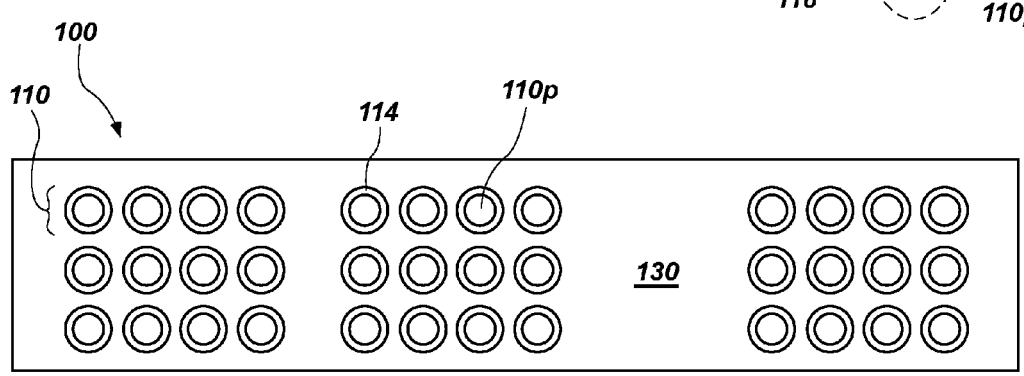

Referring to FIG. 1B, a plan view of a device wafer 100 is shown. The device wafer 100 includes conductive elements 110 formed through a dielectric material 130. The conductive elements 110 also extend through insulative material 114 formed over the dielectric material 130. Conductive pillars 110p may be formed over the insulative material 114 in contact with conductive via portion 112 (FIG. 1A). Locations of the dielectric material 130 where groups of the conductive elements 110 are spaced apart may correspond to locations where the device wafer 100 may be diced (referred to in the art as "streets") between die locations, or may be between high and low density interconnect areas (e.g., between thermal pillar regions or between TSV long or short chain areas). Although FIG. 1B shows only a few groups of conductive elements 110 on the device wafer 100, the device wafer 100 may include any number (e.g., hundreds, thousands, etc.) of conductive elements 110.

Figure 1C:
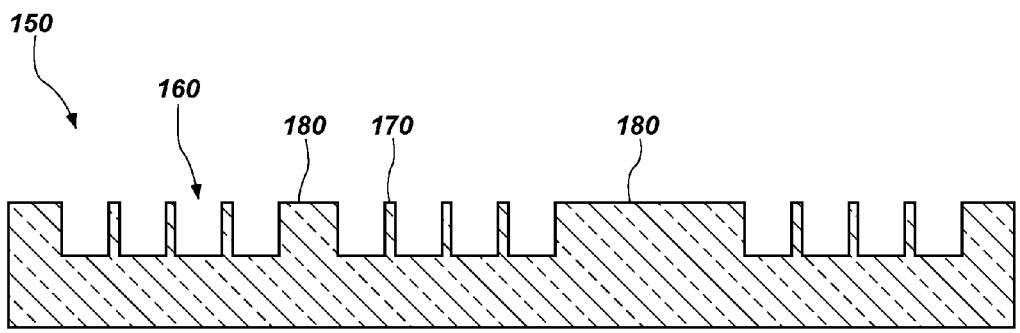

Referring to FIG. 1C, a carrier wafer 150 is shown. The carrier wafer 150 includes trenches 160, support walls 170 between trenches 160, and bonding surfaces 180 formed in a substrate material. Adjacent trenches 160 of the carrier wafer 150 may be separated by support walls 170. The support walls 170 may be configured to have a height such that a portion of the support walls 170 contacts the device wafer 100 when the device and carrier wafers 100, 150 are brought into contact. In other embodiments, the support walls 170 may be configured to have a height such that they are spaced from, and do not contact the device wafer 100 when the device and carrier wafers 100, 150 are brought into contact. The support walls 170 may be configured to separate adjacent trenches 160 and be interposed between conductive pillars 110p of the device wafer 100 when the carrier wafer 150 is bonded to the device wafer 100.

Features of the carrier wafer 150 may be configured to correspond to features of the device wafer 100. For example, the trenches 160 in the carrier wafer 150 may be sized, shaped, and configured to receive the conductive pillars 110p of the device wafer 100. For example, the trenches 160 may be square or rectangular in shape in transverse cross-section, or the trenches 160 may be V-shaped in transverse cross-section. In some embodiments, a depth of the trenches 160 may substantially correspond to a height of the conductive pillars 110p and a width of the trenches 160 may correspond to a width of the conductive pillars 110p. As used herein, unless specified otherwise, the height of the conductive pillars 110p refers to the height of the conductive elements 100 extending beyond a surface of the dielectric material 130. For example, referring to FIG. 1A, a height "h" of the conductive pillars 110p may include a distance from a surface of the dielectric material 130 to a tip of an outer portion of the conductive pillar 110p (e.g., a tip of the outer portion of solder cap 118 in the embodiment shown in FIG. 1A). In other embodiments, a depth of the trenches 160 may be greater than a height of the conductive pillars 110p.

With continued reference to FIG. 1C, the trenches 160 may be formed by conventional techniques. For example, in some embodiments, the trenches 160 are formed by forming a photomask (not shown) over the carrier wafer 150 and removing carrier wafer material, for example, by etching, to form a pattern of trenches 160 that correspond to a pattern of the conductive pillars 110p of the device wafer 100. In other embodiments, such as where a higher aspect ratio (i.e., ratio of height to width) of the trenches 160 is desired, the trenches 160 may be formed using a photoresist material and a hard mask in the removal process.

The carrier wafer 150 may include a single trench 160 for each of the corresponding conductive pillars 110p of the device wafer 100. Where each trench 160 corresponds to one conductive pillar 110p, the same mask pattern for forming the trenches 160 may also be used to form pads and other circuitry on the back side 120 of the device wafer 100. In other embodiments, each trench 160 may be sized and configured to hold multiple conductive pillars 110p. Therefore, as used herein, the term "trench" means and includes pockets sized and configured to receive a single conductive pillar 110p, as well as recesses sized and configured to received multiple conductive pillars 110p. In some embodiments, one or more dimensions of the trench is increased to receive multiple conductive pillars 110p. For example, multiple conductive pillars 110p may be received in a trench defined by a recess having a length greater than a width thereof. Similarly, as used herein, the term "support walls" means and includes walls surrounding pockets and joining other walls surrounding adjacent pockets, as well as elongated walls extending to the ends of elongated recesses. In some embodiments, the trenches 160 have a depth between about 10 μm and about 100 μm, such as between about 10 μm and about 40 μm, between about 40 μm and about 70 μm, and between about 70 μm and about 100 μm. However, the present disclosure is not limited to such depths of the trenches 160.

In some embodiments, the bonding surfaces 180 of the carrier wafer 150 are configured to bond with the dielectric material 130 of the device wafer 100. For example, the bonding surfaces 180 of the carrier wafer 150 may include the same material as the dielectric material 130 of the device wafer 100. In other embodiments, the bonding surfaces 180 may include another material that is compatible with the dielectric material 130. For example, where the dielectric material 130 is an oxide, such as silicon dioxide, the bonding surfaces 180 may include a silicon substrate material.

The bonding surfaces 180 may be present in locations of the carrier wafer 150 that correspond to locations of the dielectric material 130 on the device wafer 100. The bonding surfaces 180 may be substantially planar. The bonding surface 180 may include a material formulated to bond with a surface of the device wafer 100. The bonding surface 180 may include at least one of silicon, a silicon oxide, a silicon nitride, a silicon oxynitride, or a bulk substrate material.

Figure 1D:
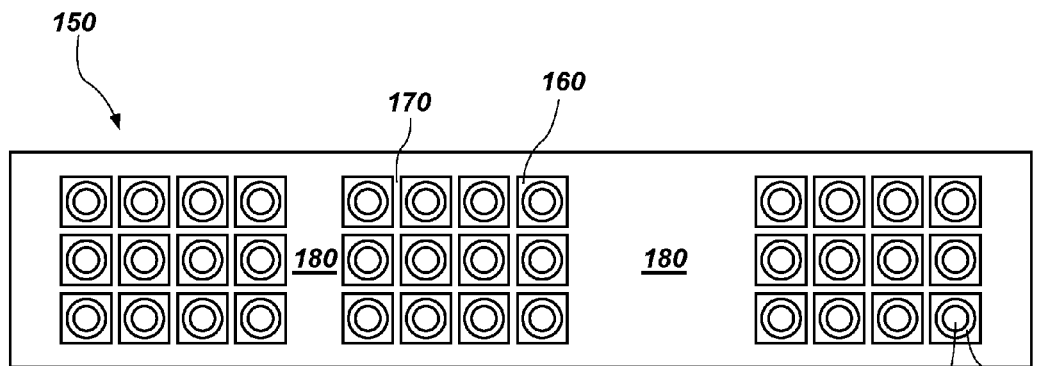

Referring to FIG. 1D, a plan view of a carrier wafer 150 with conductive pillars 110p received in trenches 160 is shown. The carrier wafer 150 includes trenches 160, support walls 170, and bonding surfaces 180. As shown in the FIG. 1D, the conductive pillars 110p may be inserted into the trenches 160 of the carrier wafer 150. The carrier wafer 150 may be configured to bond with the device wafer 100 at least at bonding surfaces 180.

Figure 1E:
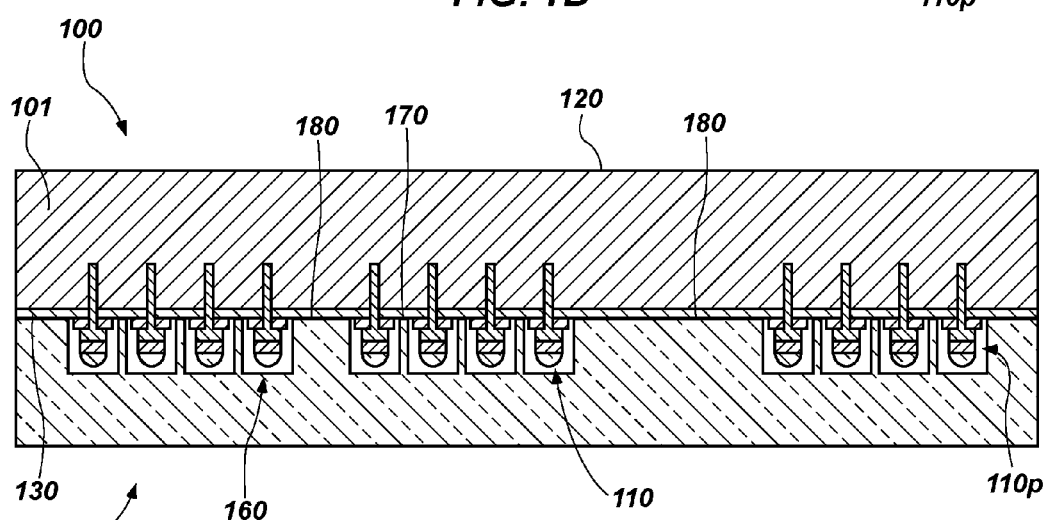

Referring to FIG. 1E, the carrier wafer 150 may be bonded to the device wafer 100. In some embodiments, the carrier wafer 150 may be bonded to the device wafer 100 without an adhesive, such as by fusion bonding. As used herein, the term "fusion bonding" means and includes activating surfaces of materials to be bonded by one of plasma treatment or with a wet chemistry, contacting the surfaces to be bonded, and exposing the contacting materials to annealing conditions, such as to a temperature between about 200° C. and about 600° C. In some embodiments, the fusion bond between the contacting materials is strengthened by exposing the contacting materials to a temperature of about 350° C. for about four hours. In other embodiments, the fusion bond may be completely formed at less than about 350° C. or before about four hours of exposure to such temperatures.

Attaching the carrier wafer 150 to the device wafer 100 by fusion bonding may enable back side processing acts to be performed at higher temperatures than otherwise possible, such as when the device and carrier wafers 100, 150 are bonded with an adhesive. The fusion bond may be stable up to temperatures of about 1,100° C. Thus, the thermal stability of the fusion bond may exceed the thermal stability of the metal materials of the device wafer 100. In some embodiments, the bond stability may enable a broader range of processing back side metallization, such as forming conductive pillars 110p from copper rather than employing solder to effect a conductive bond. For example, one device wafer 100 may be bonded to another device wafer 100 by copper to copper bonding rather than forming solder connections between the device wafers 100.

At least one of the carrier wafer 150 and the device wafer 100 may be activated with a plasma. For example, a surface of the carrier wafer 150 may be activated with a plasma or a surface of the device wafer 100, such as the dielectric material 130, may be activated with the plasma. In some embodiments, a surface of each of the device wafer 100 and the carrier wafer 150 is activated with the plasma. The plasma may be formed of oxygen, hydrogen, argon, helium, water, nitrogen, ammonia, a peroxide vapor, and combinations thereof (e.g., a mixture of hydrogen with at least one of argon and helium).

The plasma activation may activate surfaces of the carrier wafer 150 and the device wafer 100 for fusion bonding of the wafers. In some embodiments, although the surface of the carrier wafer 150 is not substantially flat or planar, the plasma may activate surfaces of the carrier wafer 150 for fusion bonding. The plasma may activate bonding surfaces 180 and exposed surfaces of the support walls 170. The plasma may also activate surfaces of the device wafer 100, such as exposed portions of the dielectric material 130.

After surface activation, the device and carrier wafers 100, 150 may be rinsed in de-ionized (DI) water or other chemical agent. In some embodiments, the device and carrier wafers 100, 150 may be bonded without rinsing the device and carrier wafers 100, 150. The device and carrier wafers 100, 150 may be aligned and surfaces of each of the device and carrier wafers 100, 150 may be brought into contact such that the device and carrier wafers 100, 150 bond by van der Waals forces. In some embodiments, the device and carrier wafers 100, 150 may be contacted under a partial vacuum to minimize the presence of any gases that may become trapped between the device and carrier wafers 100, 150 as the wafers are brought into contact.

After the surfaces of the device and carrier wafers 100, 150 are brought into contact, the strength of the fusion bond therebetween may be increased by exposing the device and carrier wafers 100, 150 to an anneal process. The bonded device wafer 100 and the carrier wafer 150 may be exposed to an anneal process, such as by exposing the bonded device wafer 100 and the carrier wafer 150 to an elevated temperature. In some embodiments, the wafers are exposed to a thermal anneal at a temperature between about 100° C. and about 600° C., such as between about 100° C. and about 200° C., between about 200° C. and about 300° C., between about 300° C. and about 400° C., or between about 400° C. and about 600° C. In some embodiments, the anneal is performed at a temperature of about 200° C. In other embodiments, the anneal is performed at a temperature of about 300° C. The anneal may be performed under a partial vacuum. In some embodiments, the fusion bond is formed at a temperature below the thermal stability limits of silicon and conductive metals of the device wafer 100. The fusion bond may have a higher thermal stability limit than silicon or the conductive metals of the device wafer 100, enabling a broader range of materials (e.g., materials of conductive elements 110) that may be formed on the device wafer 100.

The anneal may be conducted as a slow-ramp anneal and may be held for a period of time sufficient to release any gases or water vapor trapped in between the device wafer 100 and the carrier wafer 150, such as any gases that may be trapped in the trenches 160 or between surfaces of the trenches 160 and the conductive pillars 110*p*. In some embodiments, the annealing conditions may be held for a period of time between about two hours and about three hours. The slow ramp anneal may prevent any gases or water vapor trapped between the device wafer 100 and the carrier wafer 150 from expanding during subsequent processing acts, such as CVD acts, and damaging the device wafer 100. The anneal may also hermetically seal the wafers, meaning that the edges between the wafers may be sealed and prevent gas or water from entering regions in between the wafers, such as trenches 160. A complete, hermetic seal may prevent water from penetrating to the interface and into trenches 160 of the carrier wafer 150.

With continued reference to FIG. 1E, the conductive pillars 110*p* of the device wafer 100 may be received into the trenches 160 of the carrier wafer 150. In some embodiments, the conductive elements 110 may be spaced from the support walls 170. In some embodiments, a depth of the trenches 160 may be the same as or less than a height of the conductive pillars 110*p* and ends of the conductive pillars 110*p* may contact a bottom surface of the trenches 160 of the carrier wafer 150. In such embodiments, the top portions of the conductive pillars 110*p* (e.g., the solder cap 118) may contact the bottoms of trenches 160. In some embodiments, this may provide one method of controlling the uniformity of the conductive pillars 110 in the final structure and the total thickness variation (TTV) of the final device. For example, some conductive pillars 110*p* may, as formed, exhibit a height exceeding acceptable tolerances, and disposition of the solder caps thereof against the trench bottoms, flattening the ends of the solder caps in a technique characterized as "coining," may be used to reduce the excessive height and ensure greater uniformity of pillar height. In other embodiments, the conductive pillars 110*p* may have a height that corresponds to a depth of each of the trenches 160 so that there is pillar-to-trench bottom contact without any substantial coining. In still other embodiments, a height of the conductive pillars 110*p* may be less than a depth of the trenches 160, such that the conductive pillars 110*p* may be received into the trenches 160 without contacting the bottoms of the trenches 160.

Figure 1F:
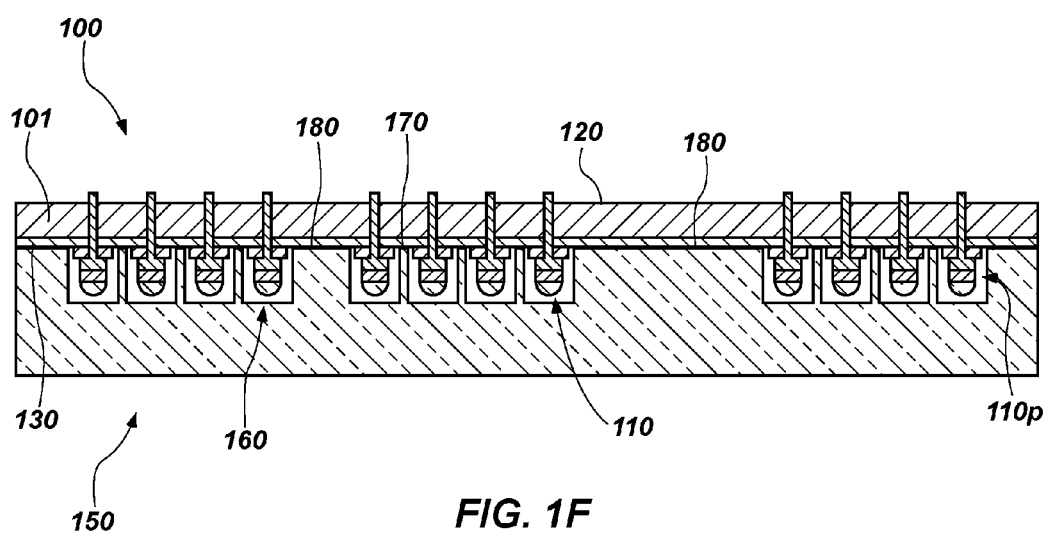

Referring to FIG. 1F, a portion of the back side 120 of the device wafer 100 may be removed, such as by back grinding or by CMP. Removing a portion of the back side 120 of the device wafer 100 may expose a portion of each of the conductive elements 110, specifically, ends of the conductive via portions 112.

Figure 1G:
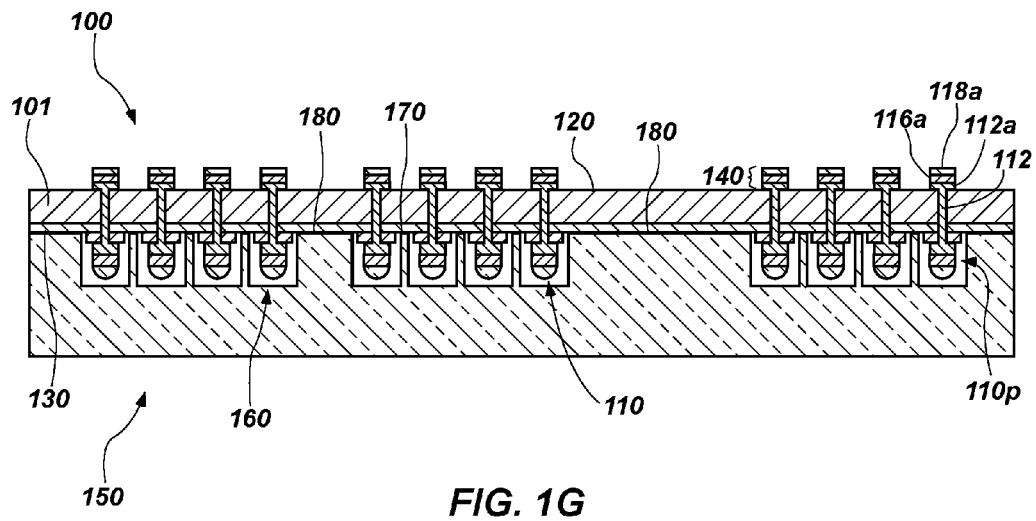

Referring to FIG. 1G, after the device wafer 100 and the carrier wafer 150 are bonded and portions of the conductive elements 110, specifically conductive via portions 112, are exposed through the back side 120 of the device wafer 100, and conductive pad structures 140 may be formed on the back side 120 of the device wafer 100. In some embodiments, conductive pad structures 140 may facilitate the electrical connection of conductive elements 110 to other conductive structures, for example, conductive pillars 110*p*, of another semiconductor device in a final semiconductor device assembly comprising multiple, stacked semiconductor devices. In other embodiments implemented as wafer level packaging, the conductive pad structures 140 of one device wafer 100 may be electrically connected to conductive pillars 110*p* of another, adjacent device wafer 100. Without limiting the scope of the present disclosure and as noted above, each conductive portion of the conductive pad structures 140 may be formed from a suitable conductive material, such as a metal or metal alloy, a conductive or conductor-filled polymer, or the like. For example, the conductive pad structures 140 may include any electrically conductive material, such as at least one of copper, nickel, platinum, gold, solder, tin, silver, tungsten, indium, conductive epoxy, and conductor-filled epoxy. In some embodiments, the conductive pad structures 140 may include a first material 112*a* compatible with conductive via portion 112 and at least another material 118*a* compatible with a material, for example, solder, of a conductive pillar 110*p* of an adjacent semiconductor device. As is known to those of ordinary skill in the art, a third material 116*a* compatible (for example, metallurgically compatible) with the first material 112*a* and the second material 118*a* may be employed between the first and second materials if they are not initially compatible.

The conductive pad structures 140 may be formed by sputtering, atomic layer deposition (ALD), chemical vapor deposition (CVD), physical vapor deposition (PVD), plasma enhanced chemical vapor deposition (PECVD), low pressure chemical vapor deposition (LPCVD), or other suitable deposition process, followed by patterning and etching.

Accordingly, a method of using a semiconductor structure is disclosed. The method comprises forming a device wafer, wherein forming the device wafer comprises forming a dielectric material over an active surface of a first substrate and forming conductive pillars on the active surface of the first substrate. The method comprises forming a carrier wafer, wherein forming the carrier wafer comprises forming trenches in a surface of a second substrate and forming at least one bonding surface on a portion of the surface of the second substrate. The method further comprises inserting the conductive pillars into the trenches and bonding the at least one bonding surface of the carrier wafer with the dielectric material of the device wafer.

Accordingly, a semiconductor structure is disclosed. The semiconductor structure comprises a carrier wafer comprising trenches within a surface of a semiconductor substrate, bonding surfaces on the surface of the semiconductor substrate, and stress cavities within the substrate proximate the bonding surfaces. The semiconductor structure further comprises a device wafer bonded to the carrier wafer comprising conductive pillars on an active surface of the device wafer disposed within trenches of the carrier wafer and a dielectric material over the active surface bonded to the bonding surfaces of the carrier wafer.

After back side processing of the device wafer 100 is complete, the carrier wafer 150 may be released from the device wafer 100. This may be accomplished by the application of thermal energy, mechanical forces, or both, such as by heating, pulling, cutting, initiating and propagating a crack, etc. In some embodiments, the device and carrier wafers 100, 150 are separated by applying a force (e.g., an upward force) to the device wafer 100, and an opposite force (e.g., a downward force) to the carrier wafer 150. In other embodiments, the carrier wafer 150 is released from the device wafer 100 by thermally cleaving the wafers.

Figure 2A:
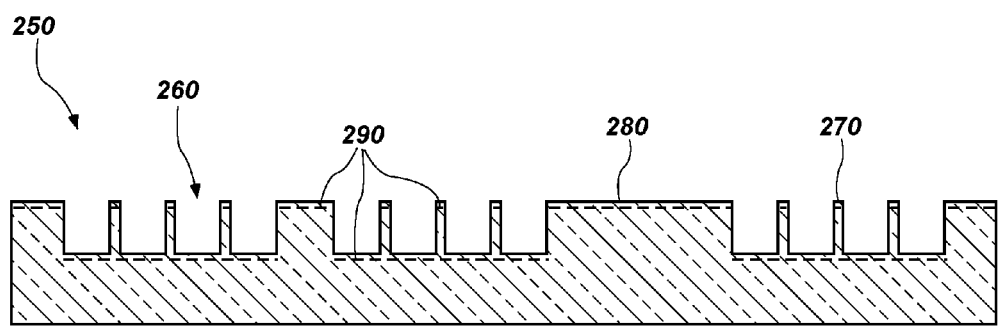
FIG. 2A through FIG. 2C are simplified cross-sectional views showing a method of attaching and releasing a device wafer to a carrier wafer according to some embodiments of the disclosure.

Referring to FIG. 2A, an embodiment of a carrier wafer 250 having hydrogen implanted regions 290 is shown. The carrier wafer 250 may include trenches 260, support walls 270, and bonding surfaces 280 as described above with reference to carrier wafer 150 (FIG. 1C). Hydrogen may be implanted into the carrier wafer 250 to form the hydrogen implanted regions 290, shown by dashed lines. The hydrogen implanted regions 290 may form a brittle plane in the material of the carrier wafer 250. The concentration of hydrogen in the hydrogen implanted regions 290 may vary from about $1 \times 10^{16}$ atoms per square centimeter ($cm^2$) to about $1 \times 10^{17}$ atoms per square centimeter. Increasing a concentration of hydrogen in the hydrogen implanted regions 290 may reduce the amount of heat required to release the carrier wafer 250 from a device wafer in later processing acts, conserving the thermal budget of the device wafer. In some embodiments, other atoms may be co-implanted into the carrier wafer 250 with the hydrogen. For example, at least one of helium and boron may be co-implanted into the carrier wafer 250 with the hydrogen. The hydrogen implanted regions 290 may have a depth of between about 200 Å and about 1,000 Å into the carrier wafer 250. In some embodiments, the depth of the hydrogen implanted regions 290 is about 500 Å. The depth of the hydrogen implanted regions 290 may be substantially uniform across a length of the carrier wafer 250.

The hydrogen implanted regions 290 may be formed after trenches 260 are formed in the carrier wafer 250. In other embodiments, the hydrogen implanted regions 290 may be formed before the trenches 260 are formed. For example, the hydrogen implanted regions 290 may be formed before patterning the carrier wafer 250 in embodiments where the implantation depth is less than about 500 Å into the carrier wafer 250.

Figure 2B:
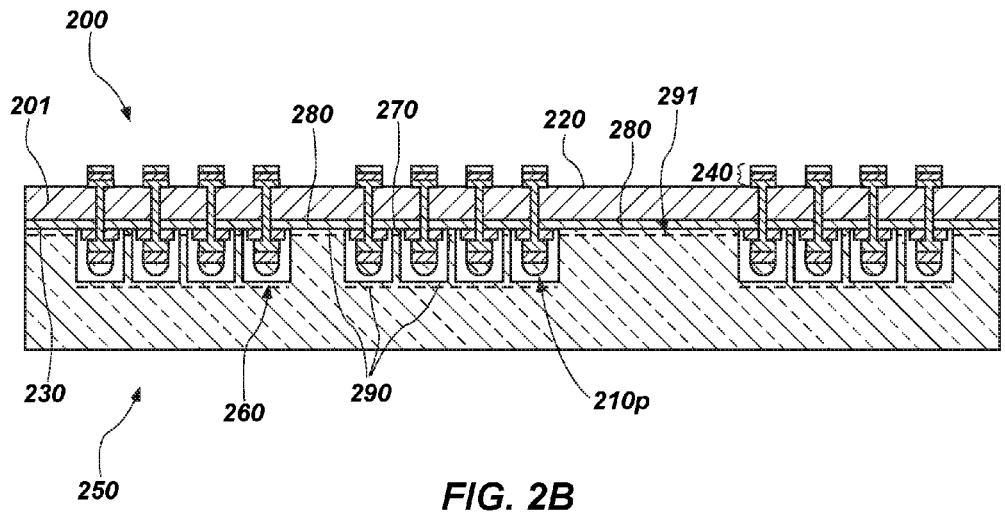

Referring to FIG. 2B, the carrier wafer 250 may be fusion bonded to a device wafer 200 and annealed, as described above with reference to FIG. 1E. The device wafer 200 may be formed on a substrate 201 and include a dielectric material 230 formed over the substrate 201. A back side 220 of the device wafer 200 may be processed and conductive pad structures 240 may be formed on the back side 220. During back side processing, the hydrogen in the hydrogen implanted regions 290 may not substantially diffuse from the hydrogen implanted regions 290. For example, in some embodiments, the temperature of the carrier wafer 250 and device wafer 200 during back side processing may not exceed about 280° C.

After completion of back side processing, the carrier wafer 250 may be released and separated from the device wafer 200. In some embodiments, the carrier wafer 250 may be released from the device wafer 200 without using a saw. For example, a thermal cleaving process may be used to release the carrier wafer 250 from the device wafer 200. When exposed to heat, hydrogen in the hydrogen implanted regions 290 may form clusters, which may create pockets (e.g., bubbles) within the carrier wafer 250. When exposed to localized heat, such as that generated by a laser, the pockets of hydrogen may enhance cleaving of the carrier wafer 250 in the brittle plane of the hydrogen implanted regions 290. The device wafer 200 may be released from the carrier wafer 250 by subjecting the hydrogen implanted regions 290 to a temperature of between about 280° C. and about 450° C. In some embodiments, the device wafer 200 and the carrier wafer 250 may be subjected to a temperature of up to approximately 350° C. In other embodiments, the hydrogen implanted regions 290 may be subjected to a temperature of approximately 280° C. A laser 291 may focus thermal energy directly on the hydrogen implanted regions 290 to promote cleaving of the wafers. The laser 291 may be applied to the hydrogen implanted regions 290 from the back side 220 of the device wafer 200. Thus, the carrier wafer 250 and the device wafer 200 may be debonded at a temperature below the thermal stability limit of conductive pillars 210p or other features on the active surface of the device wafer 200.

Figure 2C:
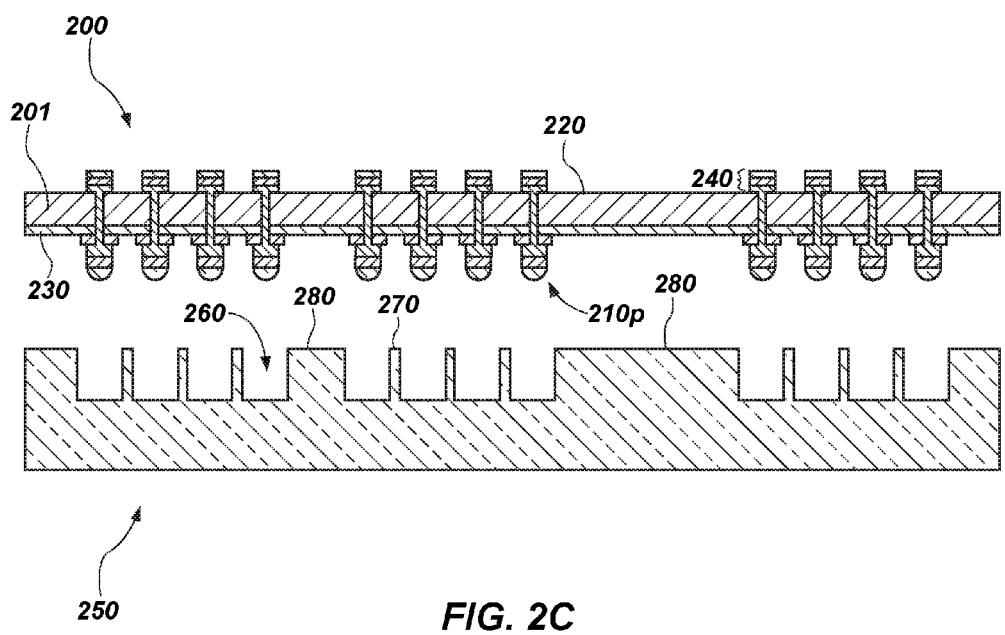

In other embodiments, the wafers may be debonded by applying a mechanical force to the wafers. The mechanical force may be in addition to the application of heat to the hydrogen implanted regions 290. For example, a force may be applied to the carrier wafer 250 and an opposite force may be applied to the device wafer 200. In some embodiments, pockets of hydrogen may be formed in the hydrogen implanted regions 290 by exposing the hydrogen implanted regions 290 to a temperature of approximately 280° C. Referring to FIG. 2C, the device wafer 200 may be separated from the carrier wafer 250 after the carrier wafer 250 is released from the device wafer 200. After the device wafer 200 is released, the carrier wafer 250 may have a thickness reduced approximately by the amount of the depth of the hydrogen implanted regions 290 (FIG. 2B). Small amounts of material from the carrier wafer 250 may remain on portions of the device wafer 200. However, no material from the carrier wafer 250 may remain in regions of the device wafer 200 proximate the conductive pillars 210p, particularly in embodiments where the carrier wafer 250 is configured to prevent bonding between the carrier wafer 250 and the device wafer 200 at regions proximate the conductive pillars 210p (e.g., at trenches 260). By protecting the conductive pillars 210p of the device wafer 200 within the trenches 260 of the carrier wafer 250 during the back stage processing, the conductive pillars 210p may be substantially free of damage or contamination conventionally caused by back stage processing acts.

The carrier wafer 250 may be reused in another fusion bonding process. For example, a surface of the carrier wafer 250 may be polished to form a fresh bonding surface 280, such as by contacting a surface of the carrier wafer 250 with a CMP polishing pad. In some embodiments, the existing trenches 260 may remain in the carrier wafer 250 after the device wafer 200 wafer is released. In other embodiments, the trenches 260 may be reformed, as described above with reference to FIG. 2A. By reusing the carrier wafer 250 in a subsequent fusion bonding process, overall semiconductor device manufacturing cost may be reduced.

Figure 3A:
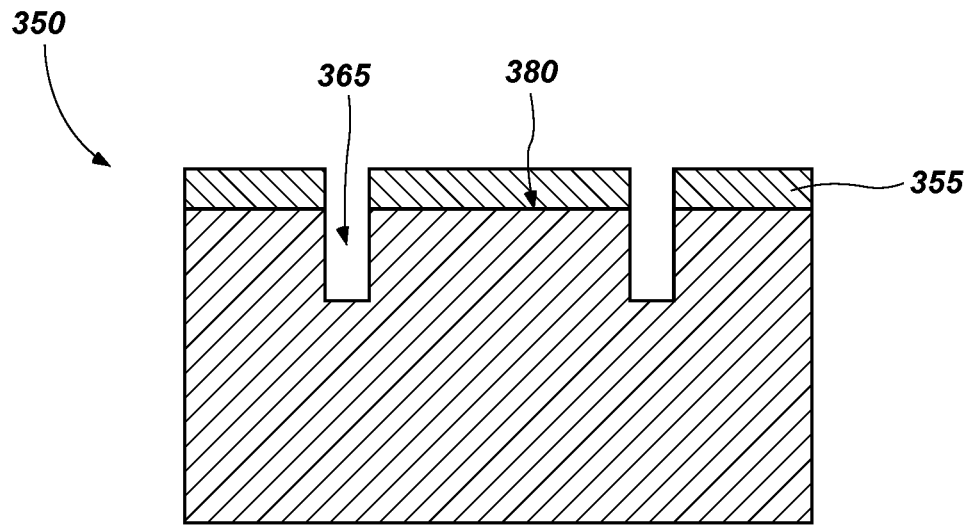
FIG. 3A through FIG. 3I are simplified cross-sectional views showing processing acts for forming a carrier wafer, fusion bonding the carrier wafer to a device wafer, and releasing the carrier wafer from the device wafer according to some embodiments of the present disclosure.

Referring to FIG. 3A, an embodiment of a carrier wafer 350 having stress patterns may be configured to assist in mechanically cleaving the carrier wafer 350 from a device wafer. A mask material 355 may overlie the carrier wafer 350 over bonding surfaces 380. The mask material 355 may include a photoresist, a hard mask, or combinations thereof. Openings may be formed in the mask material 355 and recesses 365 may be formed in the carrier wafer 350 through the openings. The recesses 365 may have a depth between about 400 Å and about 2,000 Å. In some embodiments, the recesses have a depth of about 1,000 Å.

Figure 3B:
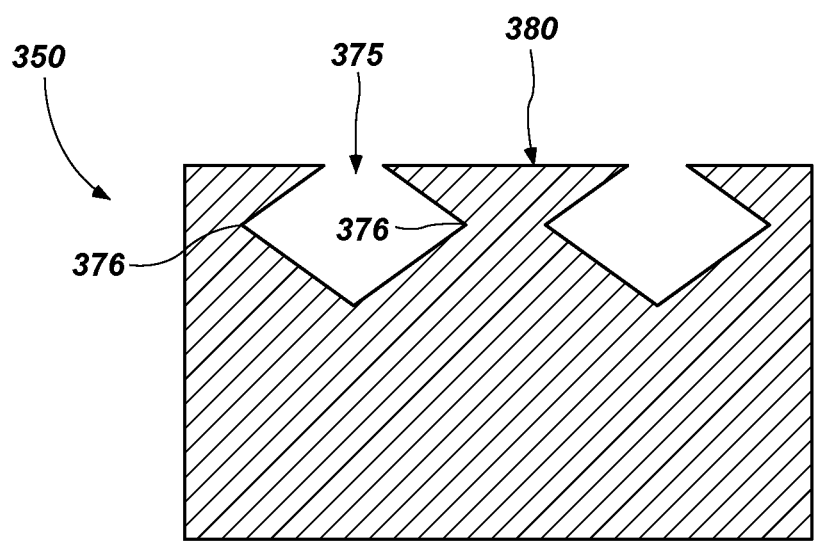

Referring to FIG. 3B, the recesses 365 (FIG. 3A) may be exposed to an anisotropic etchant to form stress cavities 375 in the carrier wafer 350. The anisotropic etchant may include a solution including tetramethylammonium hydroxide (TMAH), a solution including potassium hydroxide, or another anisotropic etchant. In some embodiments, the anisotropic etchant is a potassium hydroxide solution. The anisotropic etchant may form stress cavities 375 that terminate on <111> planes of a silicon substrate of the carrier wafer 350. The stress cavities 375 may be, for example, diamond-shaped. In some embodiments, the anisotropic etch forms an angle of approximately 54.7° in the silicon. The stress cavities 375 may include stress points 376 at lateral corners of the stress cavities 375. The stress points 376 may be formed to a depth that is approximately one-half a depth of the recesses 365 (FIG. 3A). The stress cavities 375 may be formed along bonding surfaces 380 of the carrier wafer 350. The stress points 376 may assist in debonding the carrier wafer 350 from a device wafer, as described below. The mask material 355 (FIG. 3A) may be removed from the carrier wafer 350 after forming the stress cavities 375.

Figure 3C:
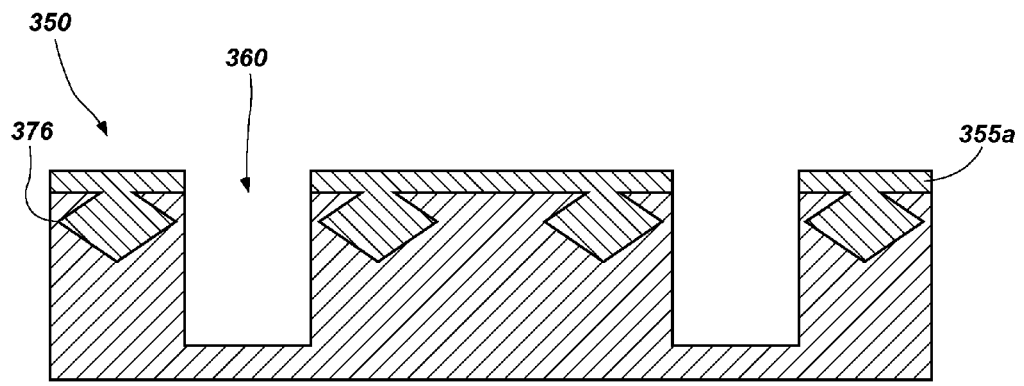

Referring to FIG. 3C, after forming stress cavities 375 (FIG. 3B), trenches 360 may be formed in the carrier wafer 350. A mask material 355a may be formed over the carrier wafer 350. The trenches 360 may be formed through openings in the mask material 355a. The trenches 360 may be formed to have dimensions as described above with respect to FIG. 1D. In some embodiments, the trenches 360 may be formed before forming the stress cavities 375.

Figure 3D:
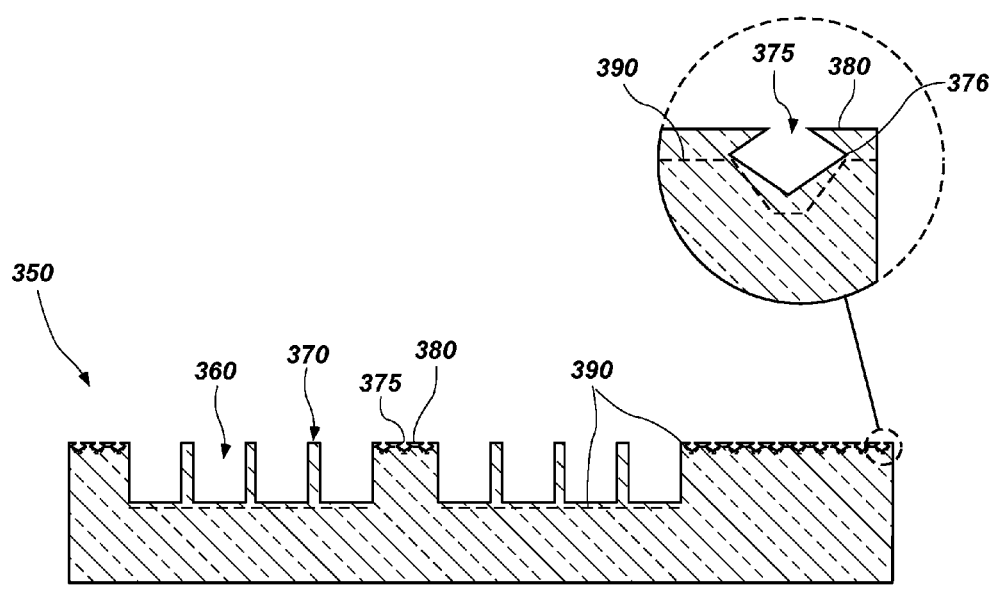

Referring to FIG. 3D, hydrogen may be implanted into the carrier wafer 350 to form hydrogen implanted regions 390, indicated with dashed lines, as described above with reference to FIG. 2A. The hydrogen implanted regions 390 may be formed under bonding surfaces 380. The depth of the hydrogen implanted regions 390 may correspond to the depth of the stress points 376 in the stress cavities 375. The carrier wafer 350 may include support walls 370 between trenches 360 as described above with reference to FIG. 1C.

Figure 3E:
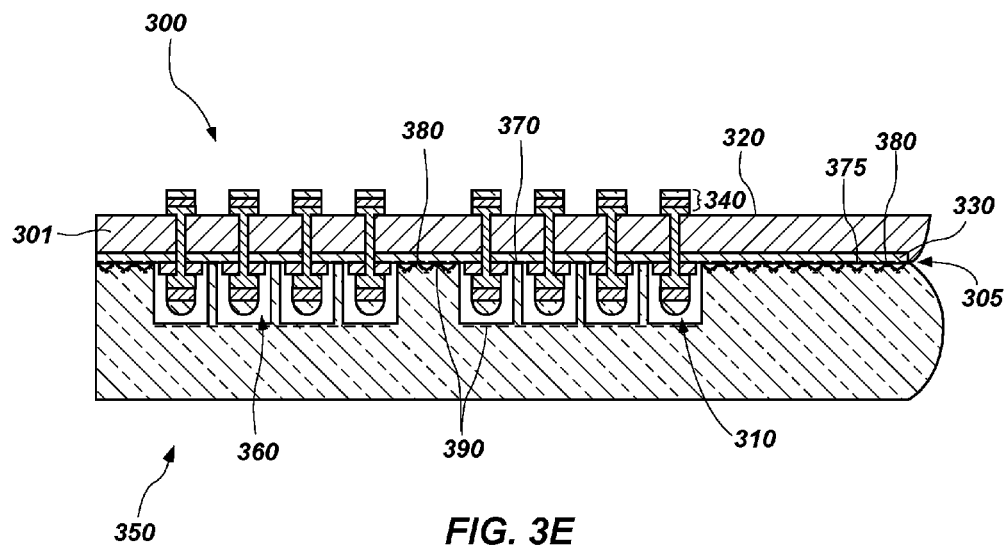

Referring to FIG. 3E, the carrier wafer 350 including the stress cavities 375 may be fusion bonded to a device wafer 300, as described above with reference to FIG. 1E. After the fusion bonding, a portion of the back side 320 of the device wafer 300 may be removed and the device wafer 300 may be subjected to back side processing, as described above with reference to FIG. 1F. For example, conductive pad structures 340 may be formed on the back side 320. The device wafer 300 may be formed from a substrate 301, include a dielectric material 330 over the active surface, and conductive elements 310 through the dielectric material 330, as described above with reference to FIG. 1A. After completion of back side processing, a beveled edge 305 may be remain at edges where the device wafer 300 and the carrier wafer 350 bond.

Figure 3F:
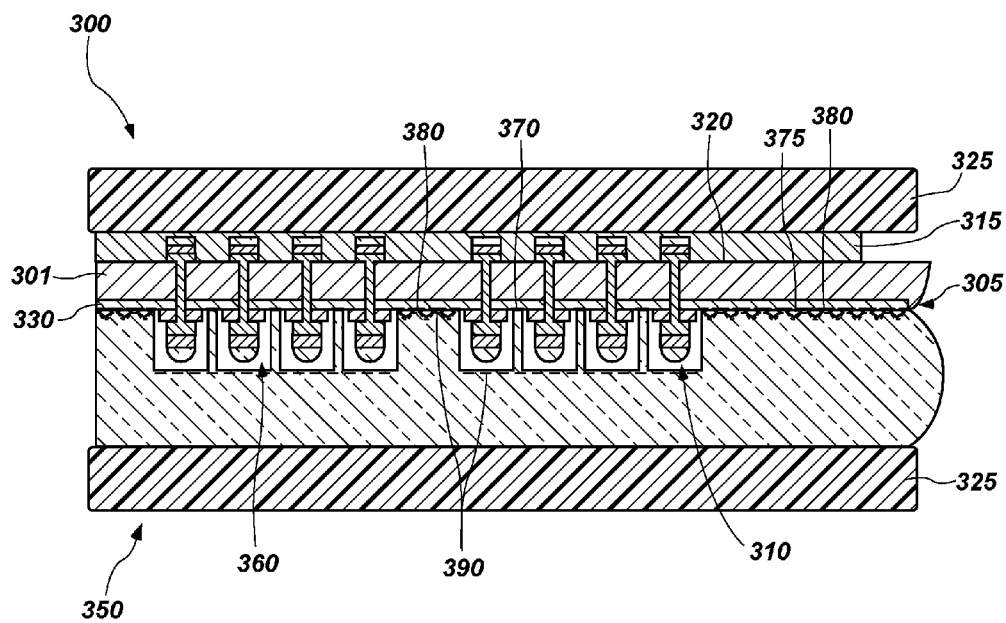

Referring to FIG. 3F, after the back side 320 of the device wafer 300 has been processed, the device wafer 300 may be released from the carrier wafer 350 by the application of a mechanical force, such as with a mechanical cleave tool. For example, a surface 315 of a porous chuck 325 of the mechanical cleave tool may contact the back side 320 of the device wafer 300. As the wafers are rotated by the mechanical cleave tool, a crack may be initiated in the beveled edge 305 around the full circumference of the wafers. By way of non-limiting example, a blade from the mechanical cleave tool may be received by the beveled edge 305 to initiate the crack. In other embodiments, the crack may be initiated by directing a liquid stream (e.g., DI water) or a gas stream (e.g., nitrogen) to the beveled edge 305. After the crack is initiated in the beveled edge 305, the mechanical cleave tool may apply a force to the device wafer 300 and an opposite force to the carrier wafer 350 to separate the wafers. The application of the force may cleave the carrier wafer 350, substantially at the plane of the hydrogen implanted regions 390 and the stress cavities 375. In some embodiments, the gas stream or liquid stream may also assist in propagation of the crack. The liquid stream may reduce contamination of the device wafer 300 by flushing away or otherwise reducing contact between the device wafer 300 and fragments (e.g., shards of the carrier wafer 350) formed during the cleave. The cleave may be guided by the location of the stress cavities 375 and may remain substantially planar along surfaces of the device wafer 300 and the carrier wafer 350. Because of the application of a mechanical force and the presence of stress cavities 375, the cleave may be performed without exposing the hydrogen implanted regions 390 to significant temperatures to preserve the thermal budget of the overall manufacturing process. In some embodiments, the hydrogen implanted regions 390 are exposed to a temperature of about 280° C. and a mechanical force is applied to cleave the wafers. At this temperature, the wafers may be cleaved without causing solder of the conductive pillars 310p to melt or reflow.

Figure 3G:
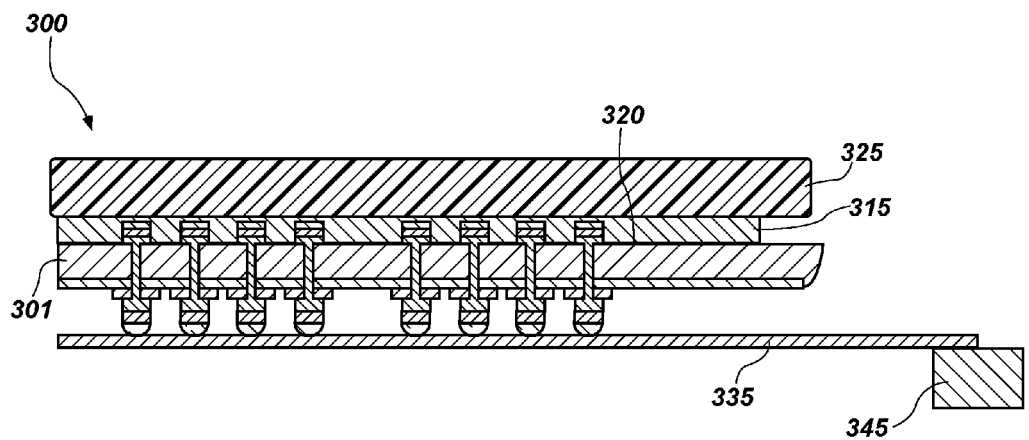

Referring to FIG. 3G, the device wafer 300 is shown after being separated from the carrier wafer 350 (FIG. 3F). The device wafer 300 may remain attached to the porous chuck 325. The device wafer 300 may then be attached to dicing tape 335 that may be mounted to a film frame 345. Material from the carrier wafer 350 (FIG. 3F) may not remain on the device wafer 300 after the device wafer 300 is released. For example, at least one of the carrier wafer 350 (FIG. 3F) and the device wafer 300 may be configured to bond only at specific locations. Material from the carrier wafer 350 (FIG. 3F) may not remain on the device wafer 300 after releasing the carrier wafer 350 (FIG. 3F) in locations where the wafers are not configured to bond, such as in the trenches 360 (FIG. 3F).

Figure 3H:
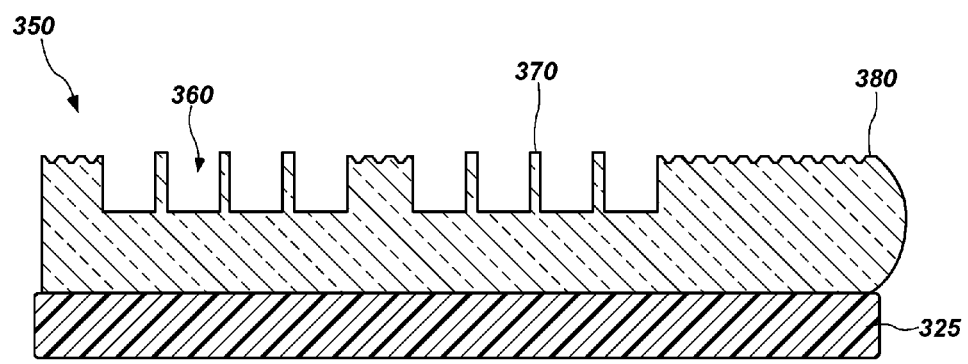

Referring to FIG. 3H, the carrier wafer 350 is shown after being separated from the device wafer 300 (FIG. 3F). The carrier wafer 350 may remain attached to the porous chuck 325 after the carrier wafer 350 has been separated from the device wafer 300 (FIG. 3F). The carrier wafer 350 at this point may have a reduced thickness compared to the thickness of the carrier wafer 350 prior to the fusion bonding. For example, the thickness of the carrier wafer 350 may be reduced by the depth of the hydrogen implanted regions 390 (FIG. 3F) and the depth of the stress points 376 (FIG. 3D).

Figure 3I:
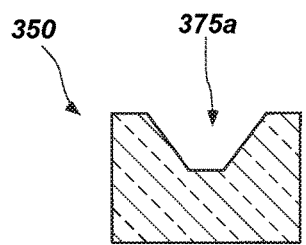

As seen in FIG. 3H, the carrier wafer 350 may have an increased surface roughness after being separated from the device wafer 300 (FIG. 3F). Referring to FIG. 3I, a top portion of the stress cavities 375 (FIG. 3D) may be removed in the cleave process, leaving recesses 375a on the carrier wafer 350. The carrier wafer 350 may have a non-planar surface after being cleaved from the device wafer 300 (FIG. 3F). In some embodiments, where the carrier wafer 350 is to be reused, the surface of the carrier wafer 350 may be planarized, such as by contacting the surface of the carrier wafer 350 with a CMP polishing pad. The surface of the carrier wafer 350 may be contacted with a CMP polishing pad for between about five seconds and about two minutes, such as between about five seconds and about ten seconds, between about ten seconds and about thirty seconds, and between about thirty seconds and about two minutes.

In some embodiments, the carrier wafer 350 may be used in another fusion bonding process. The carrier wafer 350 may be covered with a mask material and stress cavities 375 may be formed in the carrier wafer 350, as described above with reference to FIG. 3A through FIG. 3C. Hydrogen may be implanted into a surface of the carrier wafer 350, as described above with reference to FIG. 3D. The carrier wafer 350 may then be bonded to another device wafer. In other embodiments, the trenches 360 of the carrier wafer 350 may be removed, such as by grinding. Thereafter, new trenches 360, stress cavities 375, and hydrogen implanted regions 390 may be formed as described above with reference to FIG. 3A through FIG. 3D.

Figure 4A:
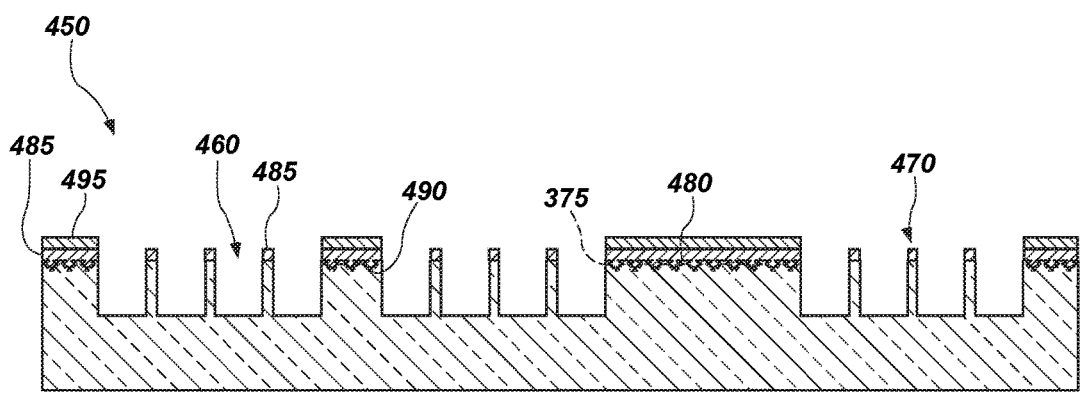
FIG. 4A through FIG. 4C are simplified cross-sectional views showing processing acts for fusion bonding a carrier wafer to a device wafer and releasing the carrier wafer from the device wafer according to other embodiments of the disclosure.

Referring to FIG. 4A, another embodiment of a carrier wafer 450 is shown. The carrier wafer 450 may include hydrogen implanted regions 490, which are indicated by dashed lines. In some embodiments, hydrogen may be implanted in the carrier wafer 450 only at bonding surfaces 480. The carrier wafer 450 may also optionally include stress cavities (not shown) as described above with reference to FIG. 3D.

The carrier wafer 450 may include a silicon nitride material 485 over bonding surfaces 480 of the carrier wafer 450. The silicon nitride material may be formed by ALD, CVD, PECVD, LPCVD, PVD, or other deposition process. The silicon nitride material 485 may have a thickness between about 10 Å and about 1,000 Å. In some embodiments, the silicon nitride material 485 may have a thickness between about 10 Å and about 100 Å. In some embodiments, the silicon nitride material 485 may be formed to include excess silicon (i.e., may be silicon rich).

An oxide material 495, such as silicon dioxide, may overlie the silicon nitride material 485 in at least some portions of the carrier wafer 450. The oxide material 495 may be formed by ALD, CVD, PECVD, LPCVD, PVD, or other deposition process. In some embodiments, the silicon nitride material 485 and the oxide material 495 are formed before forming trenches 460 in the carrier wafer 450. Trenches 460 may be formed in the carrier wafer 450 and the oxide material 495 may be removed from regions over support walls 470. A mask may be formed over the oxide material 495 located over bonding surfaces 480 and the oxide material 495 over the support walls 470 may be removed. In other embodiments, the silicon nitride material 485 and the oxide material 495 are formed over the carrier wafer 450 after the trenches 460 are formed.

Figure 4B:
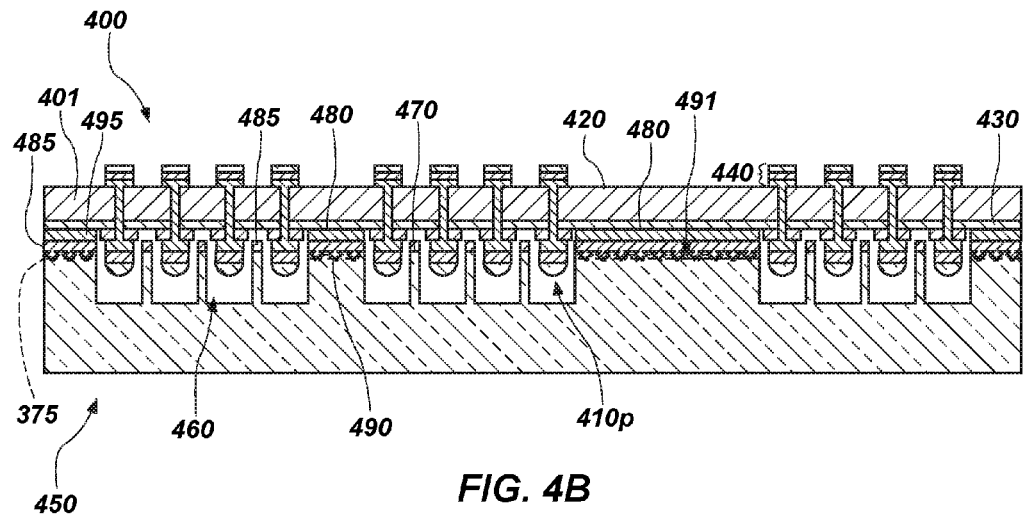

Referring to FIG. 4B, the carrier wafer 450 may be fusion bonded to a device wafer 400, as described above with respect to FIG. 1E. However, because the oxide material 495 is removed from the support walls 470, the carrier wafer 450 may not contact the device wafer 400 at the support walls 470. Thus, the carrier wafer 450 may be bonded to the device wafer 400 only at bonding surfaces 480. For example, the device wafer 400 may be contacted only by the oxide material 495 because of the height of the oxide material 495 relative to the other components of the carrier wafer 450. In some embodiments, the device wafer 400 may contact the carrier wafer 450 only along die streets or along a center axis of each die.

In some embodiments, even if the device wafer 400 contacts the silicon nitride material 485 over, for example, support walls 470, the anneal conditions may be selected such that the device wafer 400 fusion bonds to the carrier wafer 450 only at locations where the oxide material 495 on the carrier wafer 450 contacts the device wafer 400. For example, the anneal may be performed at a temperature high enough such that any oxide material 495 in contact with dielectric material 430 will bond, but at a temperature low enough such that any silicon nitride material 485 in contact with the dielectric material 430 will not bond. In some embodiments, the anneal may be performed for a period of time such that any oxide material 495 in contact with dielectric material 430 will bond, but any silicon nitride material 485 in contact with the dielectric material 430 will not bond. In other embodiments, the silicon nitride material 485 may be silicon rich and may not bond during fusion bond. The oxide material 495 may be formed over the carrier wafer 450 in regions it is desired to bond the carrier wafer 450 to the device wafer 400 and the silicon nitride material 485 may be formed over regions where a bond between the carrier wafer 450 and device wafer 400 are undesired.

The support walls 470 may reduce the total thickness variation of the device wafer 400. For example, the support walls 470 may provide structural support for regions in between conductive pillars 410p of the device wafer 400 and may prevent the device wafer 400 from bowing (e.g., arching) towards the carrier wafer 450 during back side processing. The support walls 470 may provide a physical stop to bowing and may prevent the device wafer 400 from bowing towards the carrier wafer 450 during back side processing, such as during CMP. A back side 420 of the device wafer 400 may be substantially co-planar because the support walls 470 may prevent the device wafer 400 from bowing during back side processing. After CMP or thinning of the device wafer 400, conductive pad structures 440 may be formed over a substrate 401 of the device wafer 400. The carrier wafer 450 may be exposed to heat, such as a laser 491, to release the carrier wafer 450 from the device wafer 400. The laser 491 may apply heat only to the hydrogen implanted regions 490. In some embodiments, the hydrogen implanted regions 490 are located only at the bonding surfaces 480.

Figure 4C:
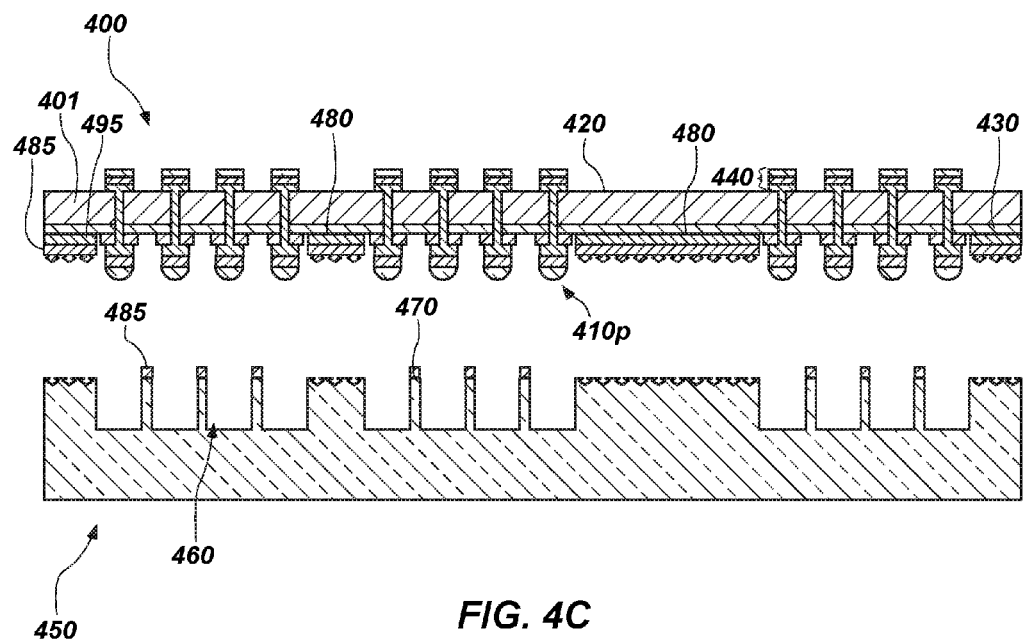

Referring to FIG. 4C, the carrier wafer 450 is released from the device wafer 400. After the carrier wafer 450 is released, the device wafer 400 may be undamaged at locations proximate the conductive pillars 410p because the device wafer 400 does not contact or bond to the carrier wafer 450 at locations proximate the conductive pillars 410p. In some embodiments, where the carrier wafer 450 includes hydrogen implanted regions 490 (FIG. 4B), portions of the silicon nitride material 485 and the oxide material 495 may remain on the device wafer 400. The silicon nitride material 485 and the oxide material 495 may be removed from the device wafer 400 after the device wafer 400 is released from the carrier wafer 450.

Figure 5:
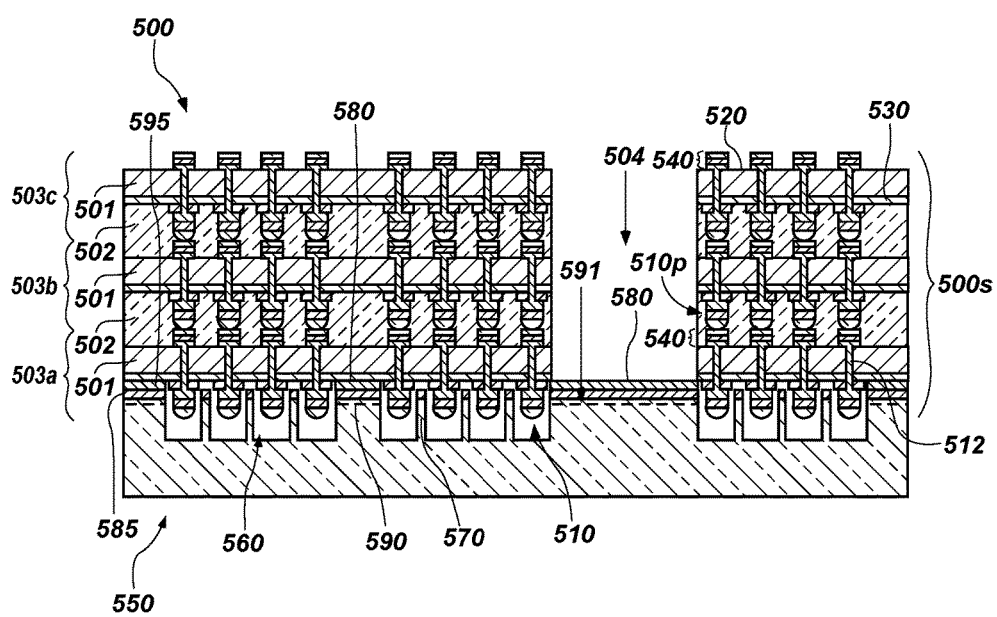
FIG. 5 is a simplified cross-sectional view showing a method of forming a stack of semiconductor devices according to some embodiments of the disclosure.

Referring to FIG. 5, a stack 500 of semiconductor device wafers 503a, 503b, 503c, etc., may be attached to a carrier wafer 550. The device wafers 503a, 503b, 503c, may be similar to the device wafer 100 described above with reference to FIG. 1F. For example, the device wafers 503a, 503b, 503c, may include a dielectric material 530 formed on a substrate 501. The stack 500 may be formed by fusion bonding a device wafer 503a to a carrier wafer 550 and removing a portion of the device wafer 503a, from a back side 520, followed by forming conductive pad structures 540 on exposed ends of conductive via portions 512 of conductive elements 510. Fusion bonding the device wafer 503a to the carrier wafer 550 may be as described above with reference to any of FIG. 1E, FIG. 2B, FIG. 3E, and FIG. 4B. Additional device wafers 503b, 503c, etc., each having had back side processing completed, may be attached to the device wafer 503a to form a stack 500, and the additional device wafers 503b, 503c, etc., fusion bonded to one another and to device wafer 503a. Conductive pillars 510p of one device wafer 503a, 503b, 503c, may be electrically connected to conductive pad structures 540 of another device wafer 503a, 503b, etc. through the fusion bonds. Each device wafer 503a, 503b, 503c, of the stack 500 may have a thickness of between about 30 µm and about 125 µm, such as about 50 µm.

The carrier wafer 550 may include trenches 560, support walls 570, bonding surfaces 580, hydrogen implanted regions 590, a silicon nitride material 585, and an oxide material 595, as described above with reference to FIG. 4A. However, although the carrier wafer 550 is shown to be similar to the carrier wafer 450 described above with reference to FIG. 4A, the carrier wafer 550 may be similar to any of the carrier wafers 150, 250, 350, described above with reference to FIG. 1D, FIG. 2A, and FIG. 3D, respectively.

Openings 504 (width exaggerated for clarity) may be formed through the stack 500 to the carrier wafer 550 in a singulation, or "dicing" process as known in the art to form singulated die stacks 500s, where each singulated die stack 500s includes a number of semiconductor dice. A wafer level underfill (WLUF) material 502 may be introduced between adjacent device wafers 503a, 503b, 503c, etc., of the stack 500 through the openings 504. The openings 504 may reduce the distance the WLUF material 502 flows from the sides of each singulated die stack 500s to fill regions between conductive pillars 510p and adjacent device wafers 503a, 503b, 503c, during heating of the WLUF material 502.

The WLUF material 502 may be subjected to an elevated temperature to at least partially cure the WLUF material 502. The WLUF material 502 may include one or more of a polymer material, a prepolymer material, a polyimide material, a silicone material (e.g., an organopolysiloxane material), an epoxy material, a resin material (e.g., a thermal plastic resin material), a curing agent (i.e., a hardener), a catalyst (i.e., an accelerator), a filler material (e.g., silica, alumina, boron nitride, etc.), a fluxing agent, a coupling agent, and a surfactant.

After the WLUF material 502 is cured, a laser 591 may be used to provide heat to release the carrier wafer 550 from the stack 500, such as described above with reference to FIG. 2B. In other embodiments, the carrier wafer 550 is released from the stack 500 by mechanical cutting, such as with a saw. Thus, the carrier wafer 550 may be used in successive wafer stacking processes. For example, successive device wafers 503a, 503b, 503c, may be attached to each other and supported by the carrier wafer 550 during a wafer stacking process. In some embodiments, the carrier wafer 550 may be recycled each time the carrier wafer 550 is released from the stack 500.

Figure 6A:
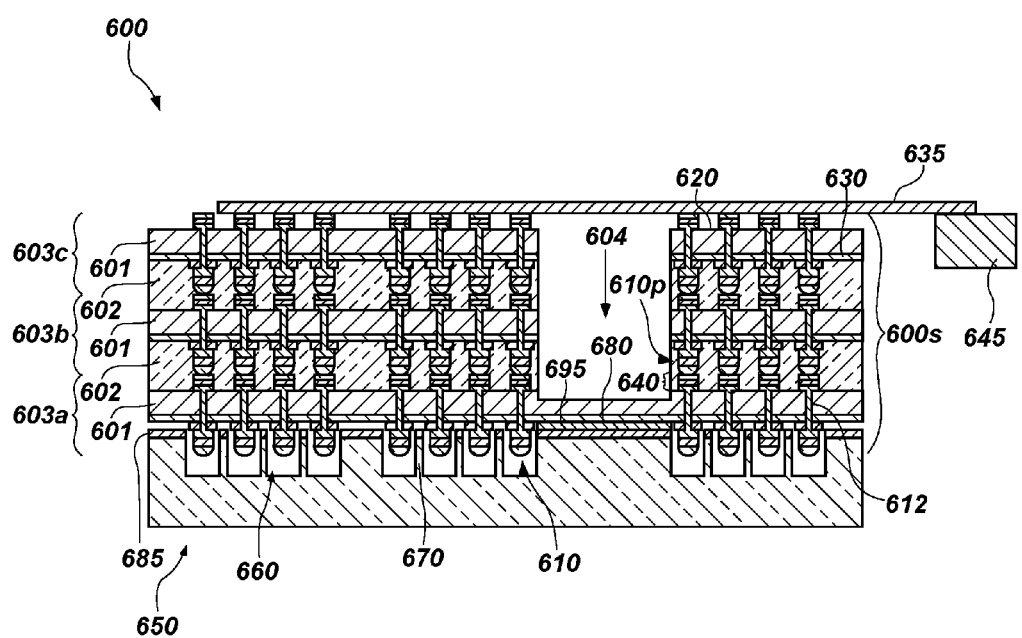
FIG. 6A and FIG. 6B are simplified cross-sectional views showing methods of forming a stack of semiconductor devices according to other embodiments of the disclosure.

Referring to FIG. 6A, device wafers 603a, 603b, 603c, etc., in a stack 600 may be mutually fusion bonded and device wafer 603a fusion bonded to a carrier wafer 650, as described above with reference to FIG. 5. The carrier wafer 650 may be similar to the carrier wafer 550 described above with reference to FIG. 5 and may include trenches 660, support walls 670, bonding surfaces 680, a silicon nitride material 685, and an oxide material 695. The device wafers 603a, 603b, 603c, may be similar to the device wafers 503a, 503b, 503c, described above with reference to FIG. 5. For example, the device wafers 603a, 603b, 603c, may include a dielectric material 630 formed on a substrate 601. The stack 600 may be formed by fusion bonding a device wafer 603a to a carrier wafer 650 and removing a portion of the device wafer 603a, from a back side 620, followed by forming conductive pad structures 640 on exposed ends of conductive via portions 612 of conductive elements 610 on a back side 620 of the device wafer 603a. Additional device wafers 603b, 603c, etc., each having had back side processing completed, may be attached to the device wafer 603a to form a stack 600 as described above with reference to FIG. 5.

The carrier wafer 650 may not be bonded to the device wafers 603a, 603b, 603c, at regions in between conductive pillars 610p, as a height of support walls 670 may be less than a level of the bonding surfaces 680. For example, the carrier wafer 650 may be bonded to device wafers 603a, 603b, 603c, of the stack 600 only at bonding surfaces 680.

The stack 600 may include any suitable number of device wafers 603a, 603b, 603c, etc. Openings 604 may be formed in the stack 600 of device wafers 603a, 603b, 603c, etc., in a dicing process to form singulated die stacks 600s. The openings 604 may terminate on or within a portion of a device wafer 603a, of the stack 600 rather than extending to the carrier wafer 650. A WLUF material 602 may be applied to stack 600 in between adjacent device wafers 603a, 603b, 603c, etc., through the openings 604. The openings 604 may reduce the distance the WLUF material 602 flows to fill regions between conductive pillars 610p and adjacent device wafers 603a, 603b, 603c. The WLUF material 602 may be subjected to an elevated temperature to at least partially cure the WLUF material 602.

Figure 6B:
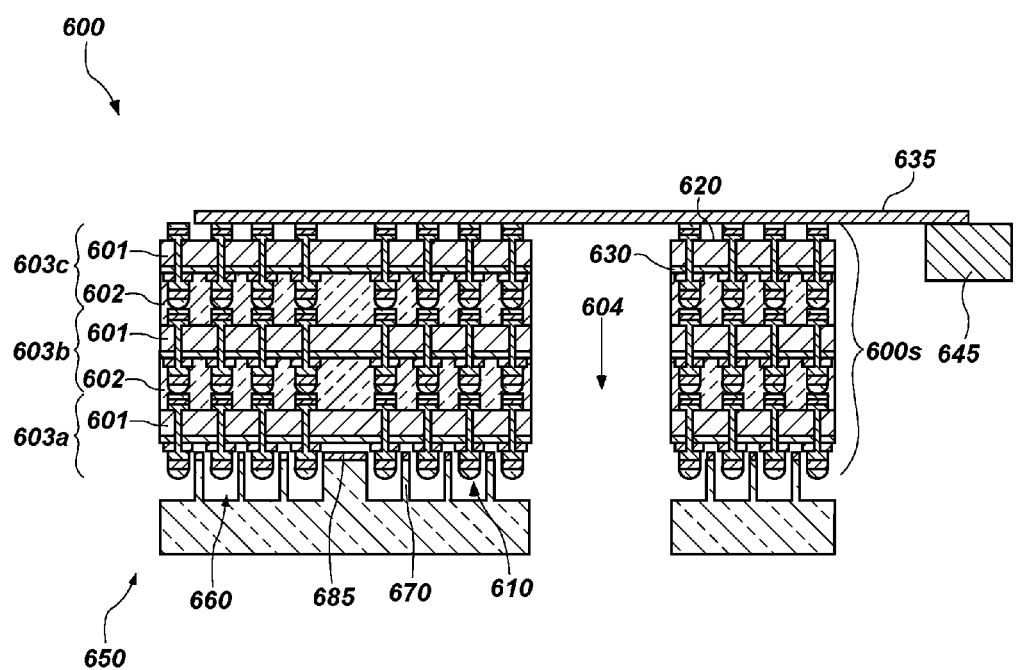

A dicing tape 635 may be attached to the stack 600 of device wafers 603a, 603b, 603c, etc., to hold the device wafers 603a, 603b, 603c, etc., in place during a dicing process. The dicing tape 635 may be mounted to a film frame 645. Referring to FIG. 6B, after the dicing tape 635 is attached to the stack 600, the underfilled device wafers 603a, 603b, 603c, may be diced into singulated die stacks 600s through the carrier wafer 650 at the locations of bonding surfaces 680 (FIG. 6A), each singulated die stack 600s comprising a number of semiconductor dice. After dicing, the portions of carrier wafer 650 associated with each singulated die stack 600s may be released from the stack 600 by inverting the film frame 645, as the support walls 670 are not bonded to device wafer 603a. Thus, the carrier wafer 650 may be released from the singulated die stack 600s without thermally cleaving and without forming stress cavities or implanting hydrogen in the carrier wafer 650. The singulated die stacks 600s may be further processed and packaged, such as by placing the stack 600 onto circuit boards, another substrate, etc. Thus, the carrier wafer 650 may enable the formation of stacks 600 of device wafers 603a, 603b, 603c, dicing of the device wafers 603a, 603b, 603c, and debonding of the carrier wafer 650 from the device wafers 603a, 603b, 603c, without damaging the device circuitry of the device wafers 603a, 603b, 603c, in the debonding process.

Accordingly, a method of forming a semiconductor device is disclosed. The method comprises forming a carrier wafer comprising trenches in a substrate and at least one bonding surface, forming a device wafer comprising conductive elements on an active surface thereof and inserting the conductive elements into the trenches of the carrier wafer, bonding the device wafer to the carrier wafer at the at least one bonding surface, removing a portion of the device wafer from a back side thereof, and releasing the carrier wafer from the device wafer.

Accordingly, a semiconductor structure is disclosed. The semiconductor structure comprises a carrier wafer comprising trenches in a surface of a substrate and at least one bonding surface, and support walls between adjacent trenches, the support walls having a height that is less than a height of the at least one bonding surface.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A semiconductor structure, comprising:
    a carrier wafer comprising:
        trenches in a substrate;
        support walls between adjacent trenches;
        hydrogen implanted regions under a surface of the substrate; and
        an oxide material over the carrier wafer; and
    at least one device wafer coupled to the carrier wafer, the at least one device wafer comprising:
        conductive elements disposed in the trenches; and
        a conductive via extending from each conductive element to a conductive pad structure on a side of the at least one device wafer opposite a side of the conductive elements.

2. The semiconductor structure of claim 1, further comprising conductive elements of another device wafer in electrical communication with conductive pads of the at least one device wafer.

3. The semiconductor structure of claim 2, further comprising a dielectric material between the at least one device wafer and the another device wafer.

4. The semiconductor structure of claim 1, further comprising a silicon nitride material disposed between the at least one device wafer and the carrier wafer.

5. The semiconductor structure of claim 1, further comprising a dielectric material over surfaces of the at least one device wafer.

6. The semiconductor structure of claim 1, further comprising a gap between the support walls and a surface of the at least one device wafer.

7. The semiconductor structure of claim 1, wherein the oxide material over the carrier wafer overlies a silicon nitride material.

8. The semiconductor structure of claim 1, further comprising at least one of helium or boron in the hydrogen implanted regions.

9. A method of forming a semiconductor structure, the method comprising:
    forming a carrier wafer, forming the carrier wafer comprising:
        forming trenches in a substrate;
        forming support walls between adjacent trenches;
        implanting hydrogen into a surface of the carrier wafer to form hydrogen implanted regions; and
        forming an oxide material over the carrier wafer;
    disposing conductive elements of at least one device wafer in the trenches of the carrier wafer, each conductive element in electrical communication with a conductive via extending through the at least one device wafer to a conductive pad structure on a side of the at least one device wafer opposite a side of the conductive elements; and
    bonding the carrier wafer to the at least one device wafer.

10. The method of claim 9, further comprising implanting at least one of helium or boron into the hydrogen implanted regions.

11. The method of claim 9, further comprising electrically coupling the conductive pad structure of the at least one device wafer to conductive elements of another device wafer.

12. The method of claim 9, further comprising forming a silicon nitride material over the carrier wafer prior to forming the oxide material over the carrier wafer.

13. The method of claim 9, wherein disposing conductive elements of at least one device wafer in the trenches comprises maintaining a gap between the support walls and a surface of the at least one device wafer.

14. The method of claim 9, further comprising exposing the hydrogen implanted regions to heat to release the carrier wafer from the at least one device wafer.

15. A method comprising:
    forming a device wafer, wherein forming the device wafer comprises:
        forming a dielectric material over an active surface of a first substrate;
        forming conductive vias extending through the device wafer;
        forming conductive pillars on the active surface of the first substrate and in electrical communication with the conductive vias; and
        forming conductive pad structures in electrical communication with the conductive vias on an opposite side of the first substrate;
    disposing at least another device wafer on a side of the device wafer opposite the active surface;
    forming a carrier wafer, wherein forming the carrier wafer comprises:
        forming trenches in a surface of a second substrate and leaving support walls between adjacent trenches;
        implanting hydrogen into a surface of the carrier wafer to form hydrogen implanted regions and doping the hydrogen implanted regions with at least one of helium and boron; and
        forming at least one bonding surface on a portion of the surface of the second substrate;
    inserting the conductive pillars into the trenches and maintaining a gap between the support walls of the carrier wafer and the active surface of the device wafer; and
    bonding the at least one bonding surface of the carrier wafer with the dielectric material of the device wafer.

16. The method of claim 15, further comprising:
    removing material from a back side of the device wafer; and
    releasing the carrier wafer from the device wafer comprising at least one of cleaving the carrier wafer at hydrogen implanted regions or stress cavities in the carrier wafer.

17. The method of claim 16, wherein releasing the carrier wafer from the device wafer further comprises separating the carrier wafer from the device wafer while leaving a silicon nitride material on surfaces of the device wafer.

18. The method of claim 16, further comprising forming stress cavities in at least one surface of the carrier wafer.

19. A semiconductor structure, comprising:
   a carrier wafer comprising:
      trenches in a substrate;
      support walls between adjacent trenches; and
      hydrogen implanted regions in the substrate, the hydrogen implanted regions doped with at least one of helium and boron;
   a device wafer bonded to the carrier wafer, the device wafer comprising:
      conductive vias extending through the device wafer;
      conductive pillars in electrical communication with the conductive vias on a first side of the device wafer; and
      conductive pad structures in electrical communication with the conductive vias on a second, opposite side of the device wafer,
      a gap between the support walls and the second side of the device wafer; and
   at least another device wafer on a side of the device wafer opposite a side of the carrier wafer.

20. The semiconductor structure of claim 1, wherein the surfaces of the support walls between the carrier wafer and the device wafer are free of the oxide material.

21. The semiconductor structure of claim 1, wherein the hydrogen implanted regions comprise regions located below lower surfaces of the trenches and regions located above the lower surfaces of the trenches.

* * * * *